United States Patent [19]
Hung et al.

[11] Patent Number: 5,347,157
[45] Date of Patent: Sep. 13, 1994

[54] MULTILAYER STRUCTURE HAVING A (111)-ORIENTED BUFFER LAYER

[75] Inventors: Liang-Sun Hung, Webster; John A. Agostinelli; Jose M. Mir, both of Rochester, all of N.Y.

[73] Assignee: Eastman Kodak Company, Rochester, N.Y.

[21] Appl. No.: 992,213

[22] Filed: Dec. 17, 1992

[51] Int. Cl.$^5$ .................. H01L 29/04; H01L 29/161
[52] U.S. Cl. ........................... 257/627; 257/12; 257/33
[58] Field of Search ............ 257/352, 245, 631, 632, 257/12, 627, 628, 183, 33; 385/130, 131, 132

[56] References Cited

U.S. PATENT DOCUMENTS 5,227,011  7/1993  Enomoto et al. ............... 156/643

FOREIGN PATENT DOCUMENTS 2-184599  7/1990  Japan .

OTHER PUBLICATIONS

T. Kanata et al., Journal of Applied Physics, vol. 62, (May 1987), pp. 2989-2993.
S. Sinharoy, Thin Solid Films, vol. 187, Jan. (1990), pp. 231-243.
A. N. Tiwari et al., Journal of Applied Physics, vol. 71, Feb. (1992), pp. 5095-5098.
T. Inoue, Applied Physics Letters, vol. 59, Oct. (1991), pp. 3604-3606.
Y. Osaka et al., Journal of Applied Physics, vol. 63, Jan. (1988), pp. 581-582.
D. K. Fork et al., Applied Physics Letters, vol. 60, Jan. (1992), pp. 1621-1623.
L. S. Hung et al., Applied Physics Letters, vol. 60, Apr. (1992), pp. 3129-3131.
P. S. Peercy et al., "Fundamental issues in heteroepitaxy—A department of Energy, Council on Materials, Science Panel Report", Journal of Materials Research, vol. 5, (Apr. 1990) p. 853 at 854.
L. S. Hung, G. M. Mason, G. R. Paz-Pujalt, J. A. Agostinelli, J. M. Mir, S. T. Lee, T. N. Blanton, and G. Ding, J. Appl. Phys. 74, pp. 1366-1374 (1993).
"Structure and Properties of Inorganic Solids" by Francis S. Galasso.
D. J. Lawrence, F. T. Smith, and S. -T. Lee, J. Appl. Phys. 69, 3011 (1991).
M. Gajdardziska-Josifovska, P. A. Crozier, and J. M. Cowley, Surface Science Letters 248, L259 (1991).

Primary Examiner—Sara W. Crane
Assistant Examiner—Nathan K. Kelley
Attorney, Agent, or Firm—Raymond L. Owens

[57] ABSTRACT

A multilayer structure comprising in order: a (111)-oriented single crystal substrate and an epitaxial metal oxide buffer layer. The substrate is doped or undoped. The substrate is a semiconductor selected from the group consisting of Si compounds, Ge compounds, and compounds having at least one element selected from the group consisting of Al, Ga, and In and at least one element selected from the group consisting of N, P, As, and Sb. The substrate defines a substrate superlattice dimension equal to 3 times a sublattice constant of the substrate. The epitaxial metal oxide buffer layer has a three-fold rotation symmetry about the substrate (111) direction. The buffer layer defines a buffer layer superlattice dimension equal to 4 times the oxygen-to-oxygen lattice spacing of the buffer layer. The buffer layer superlattice dimension is within 15 percent of the substrate superlattice dimension.

19 Claims, 5 Drawing Sheets

MULTILAYER STRUCTURE HAVING A (111)-ORIENTED BUFFER LAYER

FIELD OF THE INVENTION

This invention relates to multilayer structures, including a semiconductor substrate, which are suitable for use in electronic, optical or electrooptic applications. This invention more particularly relates to a multilayer structure having as layers: a single crystal (111)-oriented semiconductor substrate and an epitaxial buffer layer having a three-fold rotation symmetry about the substrate (111) direction.

BACKGROUND OF THE INVENTION

Different metal oxides exhibit a wide variety of useful properties including high electrical resistivities, ferroelectricity, pyroelectricity, electro-optical and nonlinear optical (NLO) properties. A potential application cited for ceramic materials exhibiting NLO properties is blue or green light sources useful for optical data storage, high speed laser printers, large screen displays and undersea communications. One approach is to use a crystal having nonlinear optical susceptibility to produce light at twice the frequency of an infrared diode laser through second harmonic generation (SHG). Lithium niobates and tantalates having the general formula: $LiNb_xTa_{1-x}O_3$, where x is a number from 0 to 1 (referred to herein as "$LiNb_xTa_{1-x}O_3$") have large nonlinear susceptibilities and transparency from 350 nm–4000 nm and these materials are commonly used for blue light generation in the form of bulk crystals. $LiNb_xTa_{1-x}O_3$ can also be provided in the form of thin films. For blue light generation with high efficiency, the $LiNb_xTa_{1-x}O_3$ NLO film and adjoining materials should form a waveguide, in which layers adjoining the nonlinear optical thin film, have lower refractive indexes than the film. Kanata, T. et al, Journal of Applied Physics, Vol. 62, (1987), pp 2989–2993, teaches the production of waveguides having c-oriented epitaxial films of $LiNbO_3$ and $LiTaO_3$ grown on substrates of sapphire: $Al_2O_3$.

A major shortcoming presented by bulk NLO crystals is the difficulty of integration in multilayer structures. $LiNbO_3$ and $LiTaO_3$ films on sapphire substrates provide a multilayer structure, however, that structure lacks a semiconductor suitable for monolithic integration. In monolithic integration; a single chip would include, for example; diode lasers, frequency doublers, light detectors and necessary electronics. Substrates suitable for monolithic integration include Si and GaAs.

It is therefore desirable to provide a multilayer structure including an epitaxial NLO film overlaying a semiconductor substrate. Semiconductor substrates, however, have a number of characteristics which limit easy application to multilayer structures for second harmonic generation. GaAs is not suitable for use as an optical buffer, since it has a very high refractive index and absorbs in the visible range. GaAs reacts with $LiNb_xTa_{1-x}O_3$ at interfaces to produce undesirable phases.

Problems are also presented by the inherent limitations of epitaxy. Even where materials have the same crystal structure and orientation, epitaxial growth requires that the misfit between lattice constants of the two layers be 15 percent or less. GaAs has a Zinc Blende structure with the lattice parameter 0.5673 nm, while $LiNb_xTa_{1-x}O_3$ has a trigonal structure (for $LiTaO_3$ a=0.5153 nm and c=1.3755 nm).

Sinharoy, S., Thin Solid Films, Vol. 187, (1990), pp 231–243 teaches the use of one or more epitaxial alkaline earth fluoride buffer layers on semiconductors including GaAs to provide lattice matching. Tiwari, A. N. et al, Journal of Applied Physics, Vol. 71, (1992), pp. 5095–5098, teaches the use of epitaxial fluoride layers as a buffer for the growth of high-temperature superconducting oxides. Epitaxial alkaline earth fluoride buffer layers have the shortcoming of high reactivity with some oxides and deteriorated crystal qualities when processed in oxygen.

Metal oxides such as $ZrO_2$, $PrO_2$, $CeO_2$, $Al_2O_3$, $MgAl_2O_4$ and MgO have been reported to grow epitaxially on Si substrates. $ZrO_2$, $PrO_2$, $CeO_2$, and $MgAl_2O_4$ are unsuitable for use as a buffer layer between GaAs and an NLO film of $LiTaO_3$ or the like. $CeO_2$ and $PrO_2$ have excessive optical absorption. $ZrO_2$ is transparent, but has a large refractive index. $MgAl_2O_4$ is colorless and has a low refractive index, but has too high a deposition temperature for use with GaAs. Orientation of epitaxial metal oxide buffer layers matches the orientation of the substrate in some cases, but not in others. Inoue, T., Applied Physics Letters, Vol. 59, (1991), pp 3604–3606, teaches epitaxial growth of (111)$CeO_2$ on (111)Si; but epitaxial growth of (110) $CeO_2$ films on (100)Si. Osaka, Y. et al, Journal of Applied Physics, Vol. 63, (1988), pp 581–582; teaches epitaxial growth of (100)$ZrO_2$ on (100)Si, but the growth of polycrystalline films on (111)Si, by the same technique.

Fork, D. K. et al, Applied Physics Letters, Vol. 60, (1992), pp 1621–1623 teaches epitaxial growth of a (100) MgO buffer layer on (100) GaAs by using pulsed laser ablation of Mg metal in an oxygen ambient. This (100)MgO buffer layer is not suitable for the growth of c-axis oriented ((0001) oriented, referred to a hexagonal system) $LiNbO_3$ or $LiTaO_3$ films because the (100) planes of GaAs and MgO have four-fold rotation symmetry about <100>, while the (0001) planes of $LiTaO_3$ have three fold rotational symmetry about <0001>. The epitaxial growth of (100)MgO is also favored by the preference of MgO films for a (100)-oriented state and the fact that the (100) planes are electrically neutral, while the (111) planes are charged.

Hung, L. S. et al, Applied Physics Letters, Vol. 60, (1992), pp 3129–3131, teaches epitaxial growth of a (110)MgO buffer layer on (100)GaAs using ultrahigh vacuum electron beam evaporation of MgO. This (110)MgO buffer layer is not suitable for the growth of c-axis oriented ((0001) oriented) $LiNb_xTa_{1-x}O_3$ films because the (110) plane of MgO has 2-fold rotational symmetry about <110>, while the (0001) planes of $LiTaO_3$ have three fold rotation symmetry about <0001>.

It is therefore desirable to provide a multilayer structure which includes a semiconductor substrate and can provide for a c-axis oriented non-linear optical film.

SUMMARY OF THE INVENTION

In the broader aspects of the invention there is provided a multilayer structure comprising in order: a (111)-oriented single crystal substrate and an epitaxial metal oxide buffer layer. The substrate is doped or undoped. The substrate is a semiconductor selected from the group consisting of $Si_xGe_{1-x}$ semiconductors, wherein x is from 0 to 1, and semiconductors having at least one element selected from the group consisting of Al, Ga, and In and at least one element selected from the group consisting of N, P, As, and Sb. The substrate defines a substrate superlattice dimension equal to 3 times a sublattice constant of the substrate. The epitaxial metal oxide buffer layer has a three-fold rotation symmetry about the substrate (111) direction. The buffer layer defines a buffer layer superlattice dimension equal to 4 times the oxygen-to-oxygen lattice spacing of the buffer layer. The buffer layer superlattice dimension is within 15 percent of the substrate superlattice dimension.

It is an advantageous effect of at least one embodiment of the invention that an epitaxial buffer layer having a three-fold rotation symmetry about the substrate (111) direction can be provided on a a single crystal (111)-oriented semiconductor substrate.

BRIEF DESCRIPTION OF THE FIGURES

The above mentioned and other features and objects of this invention and the manner of attaining them will become more apparent and the invention itself will be better understood by reference to the following description of an embodiment of the invention taken in conjunction with the accompanying drawings wherein.

DESCRIPTION OF PARTICULAR EMBODIMENTS

Figure 1:
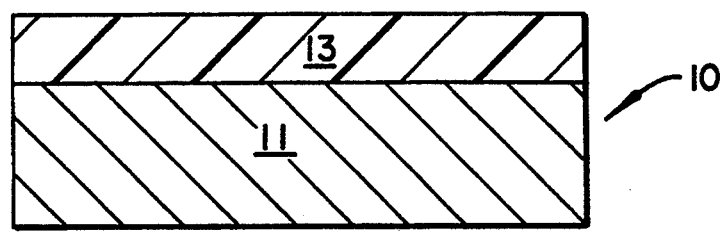
FIG. 1 A schematic diagram of an embodiment of the multilayer structure of the invention.
Figure 2:
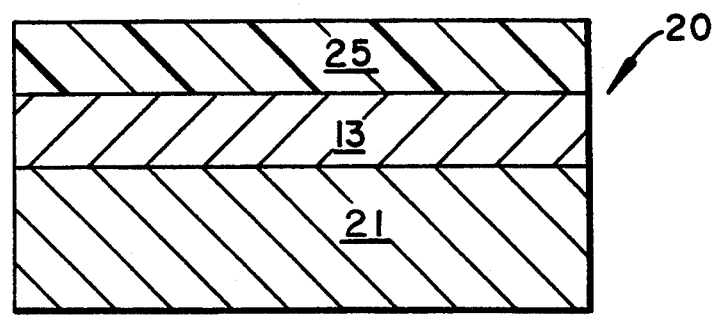
FIG. 2 A schematic diagram of an alternative embodiment of the multilayer structure of the invention.

Referring initially to FIG. 1, a multilayer structure 10 of the invention has, in order, a substrate 11 and a buffer layer 13. Referring now to FIG. 2, an alternative embodiment of the multilayer structure 10 of the invention has, in addition to substrate 11 and buffer layer 13, an upper layer 15 overlaying buffer layer 13.

Substrate 11 is a (111)-oriented single crystal semiconductor substrate. Substrate is (111)GaAs or, alternatively, substrate 11 is a (111)-oriented semiconductor selected from compounds of the Group IVa elements Si and Ge or selected from Group IIIa-Group Va compounds having at least one Group IIIa element selected from Al, Ga, and In and at least one Group Va element selected from N, P, As, and Sb. Desirably, substrate 11 is a semiconductor selected from the group consisting of Si, Ge, GaP, InAs, GaSb, InSb, InP, Si$_x$Ge$_{1-x}$, and Al$_x$Ga$_{1-x}$As, where x is from 0 to 1. These semiconductors support epitaxy and exhibit strong similarity in criteria important to epitaxy: crystal structure and lattice mismatch. Semiconductor crystal structures, (111) sublattice constants and mismatches to (111) oriented GaAs are presented in Table 1. Each of these materials has an equivalent structure to GaAs for epitaxy purposes and a sublattice constant mismatch to GaAs of less than 15 percent.

TABLE 1

| Semi-conductor | Structure | (111) Sublattice constant in Angstroms | Mismatch to (111) GaAs in percent |
|---|---|---|---|
| GaAs | ZnS(Zinc blende) | 5.653 | — |
| GaP | ZnS(Zinc blende) | 5.450 | −3.59 |
| AlAs | ZnS(Zinc blende) | 5.656 | 0.05 |
| Al$_x$Ga$_{1-x}$As | ZnS(Zinc blende) | 5.653–5.656 | 0–0.05 |
| InP | ZnS(Zinc blende) | 5.869 | 3.82 |
| InAs | ZnS(Zinc blende) | 6.058 | 7.16 |
| GaSb | ZnS(Zinc blende) | 6.096 | 7.84 |
| Si | ZnS(Diamond) | 5.431 | −3.93 |
| Ge | ZnS(Diamond) | 5.658 | 0.08 |

Each of the semiconductors listed in Table 1 has an equivalent crystal structure to GaAs in terms of epitaxy, ZnS(zinc blende or diamond), and a small lattice constant mismatch to GaAs of less than 8 percent. Peercy, P. S., (chair), et al, "Fundamental issues in heteroepitaxy—A Department of Energy, Council on Materials Science Panel Report", Journal of Materials Research, Vol. 5, (Apr. 1990), p. 853 (at 854); notes that it is a long held precept of epitaxy that for two materials of the same crystal structure and orientation, "epitaxial growth requires a misfit $\epsilon$ ($\epsilon = |b - a|/a$ where a and b are the in-plane lattice constants of substrate and overgrowth) of not more than about 15%"; or stated more generally: "an epitaxial relationship is probable whenever the orientation of the substrate and overgrowth produces an interface with a highly coincident atomic structure having low interfacial energy relative to a random arrangement." The same principles apply to a comparison of two materials support of epitaxial growth of an overlayer of a third material.

Substrate 11 can be an undoped, lightly doped or heavily doped semiconductor. In some circumstances a doped semiconductor is more desirable because an electrode can be provided beneath the buffer layer. Such an electrode would lower electro-optic device voltage requirements, where an electric field is applied normal to the substrate surface. Suitable dopants include, for a Group IVa compound: As, P, B, Sb, and Bi and for a Group IIIa-Group Va compound: Si, Ge, Zn, and Mg. Substrate 11 may be doped everywhere or only in selected areas on the substrate surface. In some applications, part of the semiconductor can be used as substrate 11 for multilayer structure 10, while the remainder of the semiconductor wafer can be processed to form laser diodes or other electronic devices.

Epitaxial metal oxide buffer layer 13 has a three-fold rotation symmetry, or both three-fold and six-fold rotation symmetry, about the substrate <111> direction, that is buffer layer 13 has the same rotation symmetry as substrate 11, about the surface normal of substrate 11. Suitable metal oxides include: (111)MgO, (0001)Al$_2$O$_3$, (0001)Ga$_2$O$_3$, and (111)SrTiO$_3$. Buffer layer 13 is stable at high temperatures and acts as a diffusion buffer between substrate and an overlying film, for example, a nonlinear optical (NLO) upper layer 15. The thickness of buffer layer 13 is selected so as to be sufficient to provide this function. The material of buffer layer 13 is selected to meet a particular purpose. SrTiO$_3$ is not suitable for supporting waveguides because of its high refractive index, but is useful for the growth of various non-optical materials. When upper layer 15 is to be a nonlinear optical waveguide, then the diffusion buffer 13 also has to be transparent over a wide range of wavelengths in addition to having a lower refractive index than the nonlinear optical film. MgO, $Ga_2O_3$ and $Al_2O_3$ are suitable for this purpose. If buffer layer 13 is to form part of a waveguide, then, to prevent guided wave loss, the thickness should be such that the strength of the evanescent tail of the mode of the wave propagating in the waveguide is negligible at the interface of substrate 11 and buffer layer 13. A sufficient thickness ranges from 30 to 3000 nm, preferably 200–2000 nm; most preferably about 500–1500 nm. Buffer layer 13 can be grown epitaxially by many conventional means, such as laser ablation, electron beam and chemical vapor deposition.

The structural relationship between buffer layer and substrate can be described in terms of a pair of superlattices defined by the two materials. The presence of these two superlattices allows for epitaxy of what would be considered otherwise to be unlike crystal structures. The substrate superlattice cell is composed of 3 cells of the substrate lattice. A substrate superlattice dimension can be defined as being equal to 3 times a sublattice constant of the substrate. For (111)GaAs the sublattices are Ga and As and the sublattice constant is 4.00 Angstroms. The superlattice dimension for GaAs is thus 12.00. Buffer layer 13 has a superlattice cell composed of four cells of the metal oxide buffer layer lattice. The buffer layer superlattice dimension is equal to 4 times the oxygen-to-oxygen lattice spacing of buffer layer 13. For (111)MgO, the O—O spacing is 2.98 Angstroms and the superlattice dimension is 11.92. The percentage difference between substrate and buffer layer superlattice dimensions is referred to herein as superlattice mismatch. For example, (111)MgO has a superlattice mismatch of −0.67 percent to (111)GaAs. Symmetries, O—O spacings, and mismatches for a variety of metal oxides are presented in Table 2.

TABLE 2

| Oxide | Symmetry of oxygen sublattice | O—O Distance in Angstroms | Mismatch to (0001) $LiTaO_3$ (in %) | Mismatch to (111) GaAs (4:3) |
| --- | --- | --- | --- | --- |
| (0001) $LiTaO_3$ | 6-fold | 2.97 | — | — |
| (111) MgO | 6-fold | 2.98 | +0.34 | −0.67 |
| (0001) $Al_2O_3$ | 3-fold | 2.70 | −9.09 | −10.00 |
| (0001) $Ga_2O_3$ | 3-fold | 2.81 | −5.39 | −6.33 |
| (111) $SrTiO_3$ | 6-fold | 2.76 | −7.07 | −8.00 |
| (111) GaAs | 6-fold | 4.00 | — | — |

Buffer layer 13 acts as a seed for the epitaxial growth of upper layer 15. An oxide upper layer 15 can be grown by any conventional methods, such as rf-sputtering, electron-beam evaporation, laser ablation and metal organic chemical vapor deposition. Suitable metal oxides for upper layer 15 have either 3-fold or 6-fold rotation symmetry about the substrate <111> direction. Examples of suitable upper layer oxides include: $BaFe_{12}O_{18}$ and $LiNb_xTa_{1-x}O_3$ ($0<x<1$). $LiNb_xTa_{1-x}O_3$, which includes $LiNbO_3$ and $LiTaO_3$, exhibits substantial nonlinear optical effects. $LiNb_xTa_{1-x}O_3$ crystals have three-fold rotational symmetry about the <0001> direction, alternatively called the c-axis, and thus belong to the trigonal system; in addition, $LiNb_xTa_{1-x}O_3$ crystals exhibit mirror symmetry about three planes that are 60° apart. These two symmetry operations classify $LiNbO_3$, $LiTaO_3$ and other $LiNb_xTa_{1-x}O_3$ compounds as members of the 3m point group, and can be referred to as conventional hexagonal unit cells. Since the nonlinear susceptibility of $LiNb_xTa_{1-x}O_3$ is not isotropic, when light propagates in lithium niobate-tantalate films, the efficiency of the generation of harmonic waves strongly depends on the orientation of the films and the polarization of the input light. The efficiency is substantially increased when the c-axis is perpendicular to the film surface as this allows the utilization of the $d_{33}$ nonlinear optic coefficient and quasi-phase matching.

As indicated for $LiTaO_3$ in Table 2, upper layer 15 oxides exhibit an oxygen-to-oxygen sublattice, which has a mismatch to the buffer layer 13 oxygen-to-oxygen sublattice of less than 15 percent and preferably less than 10 percent. Upper layer 15 and buffer layer 13 need not exhibit the same structure. For example, substrate 11 can have the diamond or zinc blende structure, buffer layer 13 can be simple cubic, and upper layer can be trigonal or hexagonal. $LiTaO_3$ has a trigonal structure with $a=0.5153$ nm and $c=1.3755$ nm, whereas MgO has a NaCl type-cubic structure with $a=0.421$ nm.

The multilayer structure 10 of the invention is produced by epitaxially growing buffer layer 13 on substrate 11, followed by epitaxially growing upper layer 15 on buffer layer 13. In a particular embodiment of the invention, multilayer structure 10 is produced by epitaxially growing an (111)MgO buffer layer, on $(NH_4)_2S_x$-treated GaAs substrate 11, by electron-beam evaporation. A $LiNb_xTa_{1-x}O_3$ ($0<x<1$) upper layer is then epitaxially grown by pulsed laser deposition on the MgO buffer layer. A suitable substrate heater temperature for the growth of the upper layer is 525° C. to 750° C.

The following example is presented for a further understanding of the invention.

EXAMPLE (111)GaAs wafers were first etched for use as substrates. After a conventional cleaning in organic solvents, the wafers were etched in a solution with 1 part of $H_2SO_4$, 8 parts of $H_2O_2$, and 500 parts of $H_2O$ for 30 seconds, followed by a deionized water rinse. Prior to being loaded in an evaporator, the samples were placed in a saturated $(NH_4)_2S_x$ solution for 3 to 5 minutes. Following this soak, the ammonium sulfide solution was diluted with deionized water and the samples were immersed in a diluted solution for 3 to 5 minutes before being dried under a stream of nitrogen. This etching method allows the growth of epitaxial films on GaAs without in situ thermal etching or sputter cleaning.

A buffer layer of MgO with a thickness of 100 nm was deposited on the $(NH_4)_2S_x$-treated (111)GaAs substrate at 550° C. by electron-beam evaporation. The deposition process was carried out at $3\times10^{-8}$ Torr without introducing additional oxygen into the system, to ensure an undisturbed GaAs surface prior to the growth of epitaxial MgO film. The substrate was heated by a radiative heater consisting of tantalum wires. The growth temperature was 400° C. to 550° C. and monitored by an infrared pyrometer using published emissivity values. The deposition rate was 0.05–0.15 nm/s and the thickness of the MgO buffer layer was between 100 and 500 nm.

LiTaO$_3$ upper layers were grown by pulsed laser ablation. A laser pulse energy of 360 mJ with a 30 ns duration and a pulse rate of 4 Hz was generated by a KrF excimer laser. The beam was focused to a 5 mm$^2$ spot onto a target of polycrystalline LiTaO$_3$. The multilayer structure (MgO buffer layer/GaAs substrate) was located 6 cm from the target and heated to 560° C. by a resistive heater. The temperature was monitored by a thermocouple attached to an inner wall of the heater block. The deposition was carried out at a rate of 0.1 nm/pulse under an oxygen pressure of 92 mTorr to provide a multilayer structure of the invention having an upper layer of LiTaO$_3$ having a thickness of 400 nm. The sample was then cooled to room temperature with oxygen flowing at a pressure of 150 Torr.

The X-ray diffraction techniques were employed during preparation of the multilayer structure, which are well known and are illustrated by B. D. Cullity, Elements of X-ray Diffraction (Addison-Wesley, Reading, Mass.).

Theta-2-theta x-ray diffraction was conducted to determine the distribution of the crystal orientation with respect to the substrate surface normal. In theta-2-theta x-ray diffraction, only lattice planes parallel to the substrate surface will be detected; this means for single-crystalline films that strong lines are detected only if a major crystallographic direction is aligned with the substrate surface. Rocking curves were measured with a stationary detector positioned at an appropriate diffraction angle 2-theta by tilting the sample through a suitable angle range.

X-ray pole figure measurements were taken to examine in-plane orientation. In x-ray pole figure analysis, a beam of monochromatic x-radiation is diffracted from a thin film, and the sample is tilted to such a degree that a selected set of parallel crystallographic planes meet the Bragg condition. The film is then rotated about an axis normal to the substrate. Detected diffraction over a wide range of rotation angles (referred to as azimuth angles) indicates a distribution of in-plane orientations. For (111)-oriented single crystalline MgO or c-oriented single crystalline LiTaO$_3$, ideal alignment is seen as three spot reflections separated one from the other by a 120° rotation angle. A poor in-plane alignment corresponds to a large number of individual microcrystalline film segments (referred to as grains) separated by high angle intergrain boundaries, that could lower critical current densities in superconductors or increase light scattering in optical materials.

Figure 3:
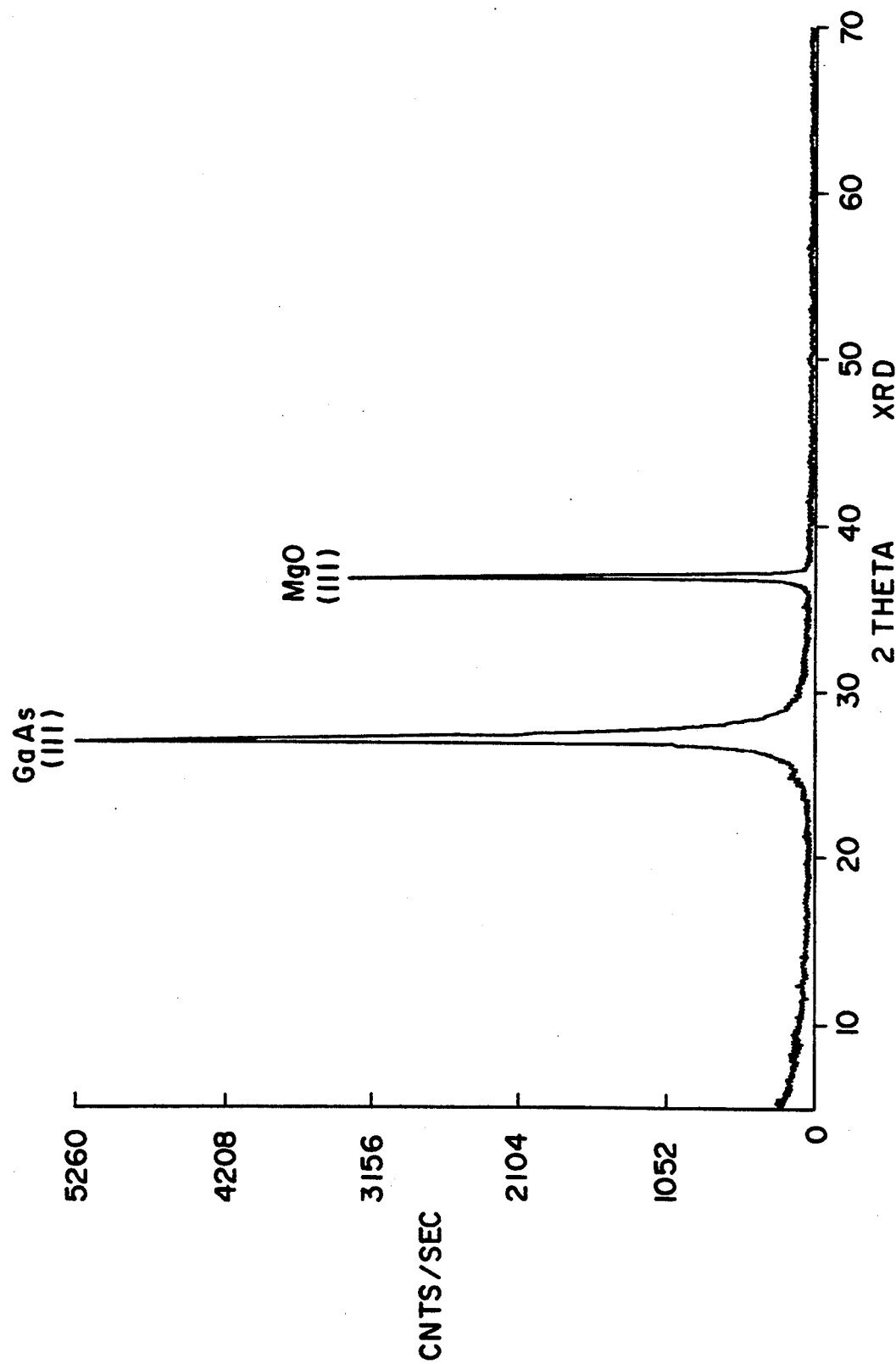
FIG. 3 An x-ray diffraction pattern of Example 1 without the nonlinear optical (NLO) film.
Figure 4:
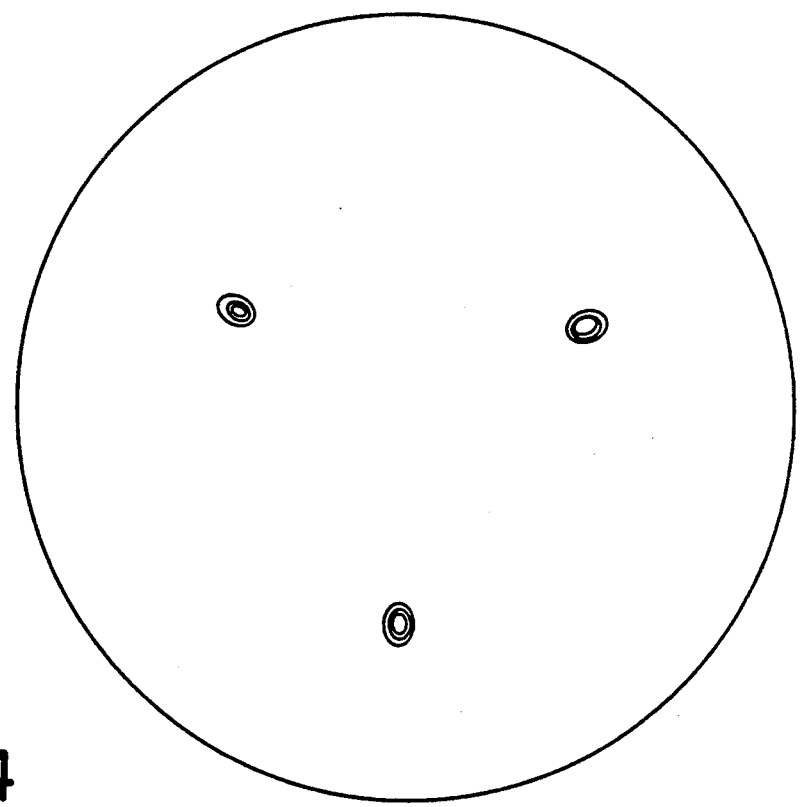
FIG. 4 An x-ray pole figure of (200)MgO reflection of the multilayer structure of Example 1 without the NLO film.
Figure 5:
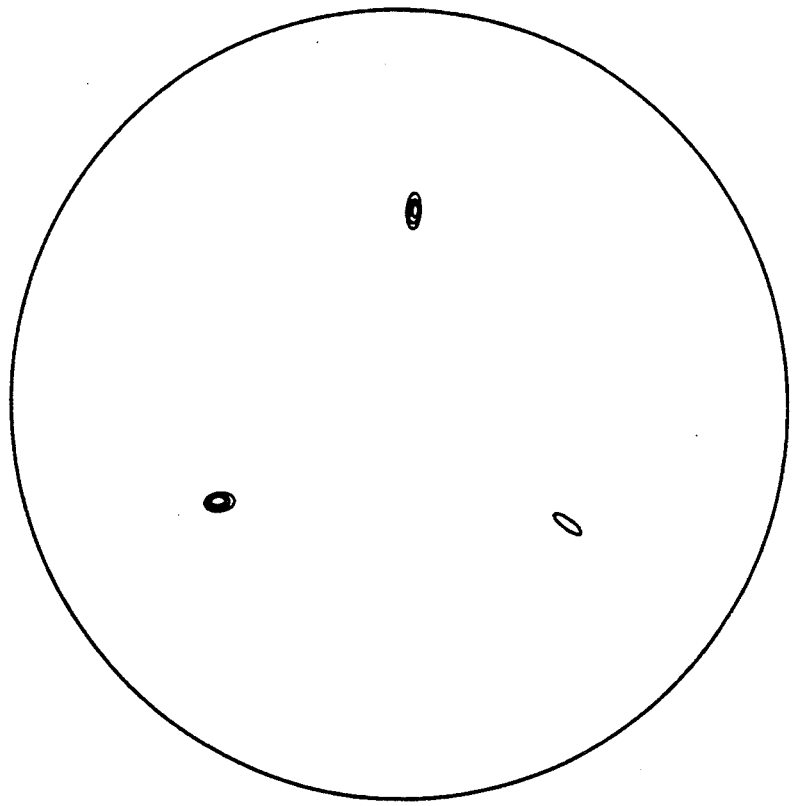
FIG. 5 An x-ray pole figure of (200)GaAs reflection structure of Example 1 without the NLO film.

FIG. 3 is an x-ray diffraction pattern and FIGS. 4 and 5 are pole patterns, taken prior to deposition of the NLO upper layer 15. Only the peak corresponding to the MgO(111) plane was observed. X-ray rocking curve analysis showed the full-width at half maximum (FWHM) of the (111)line was about 2.2°, indicating a highly (111)-oriented film. Crystal orientation in the (111) plane was examined by pole figure measurements. FIG. 4 is a pole figure of the MgO(200) planes. Three spot-like pole densities were found every 120°, indicating a good in-plane alignment. FIG. 5 is a pole figure of the (200)plane of the underlying GaAs substrate. The figure shows excellent in-plane alignment as expected for high-quality single crystal GaAs wafers. A comparison of the results shown in FIGS. 4 and 5 indicated that a single crystal (111)-oriented MgO buffer layer had been grown on the (111)GaAs substrate, and that the MgO lattice was rotated by 180° about the [111]surface normal with respect to the GaAs substrate.

Figure 6:
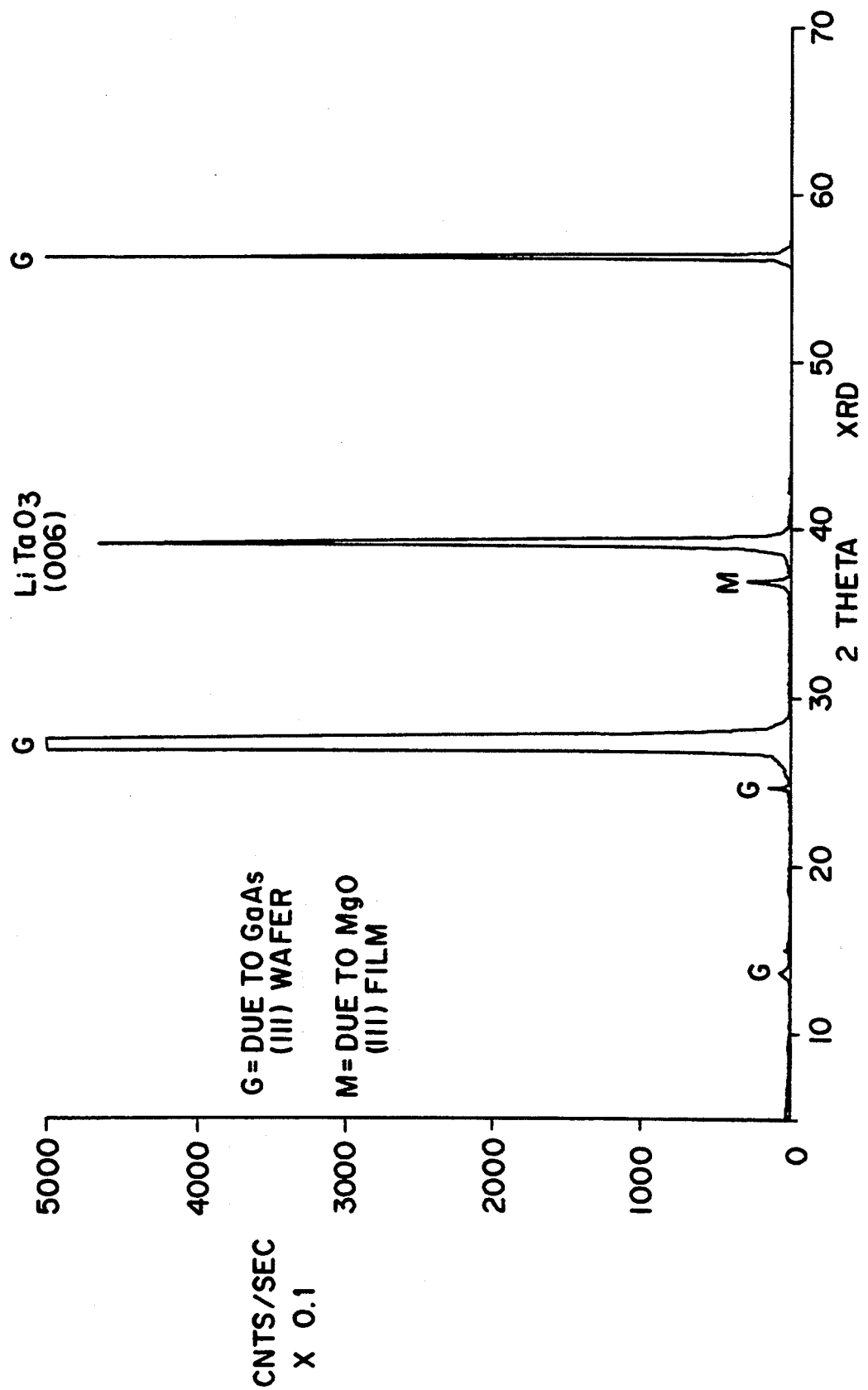
FIG. 6 An x-ray diffraction pattern of the multilayer structure of Example 1.
Figure 7:
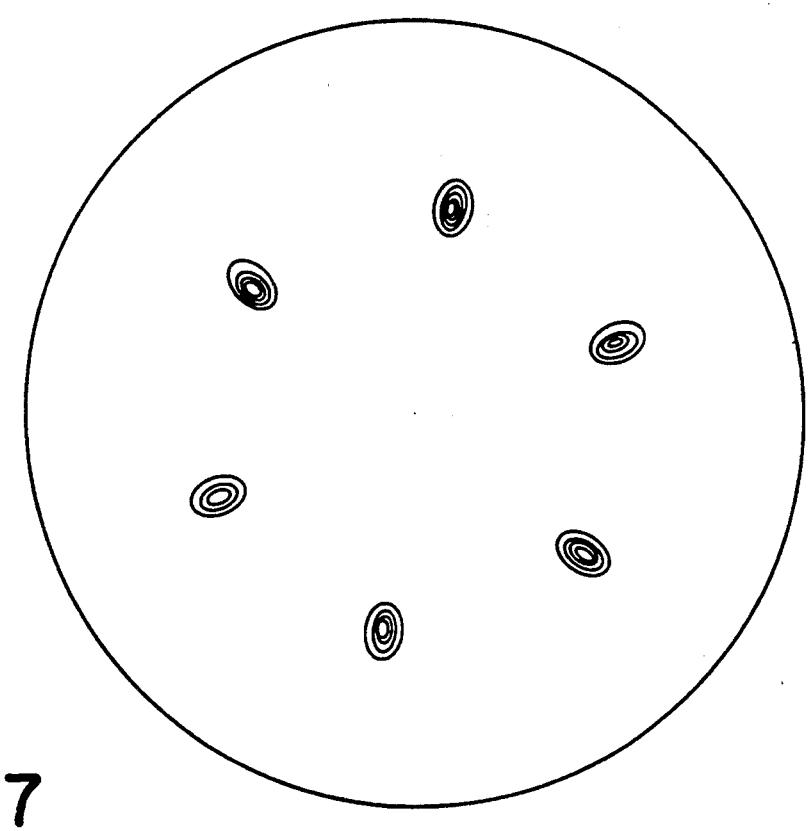
FIG. 7 An x-ray pole figure of LiTaO$_3$ (01-12) reflection of the multilayer structure of Example 1.
Figure 8:
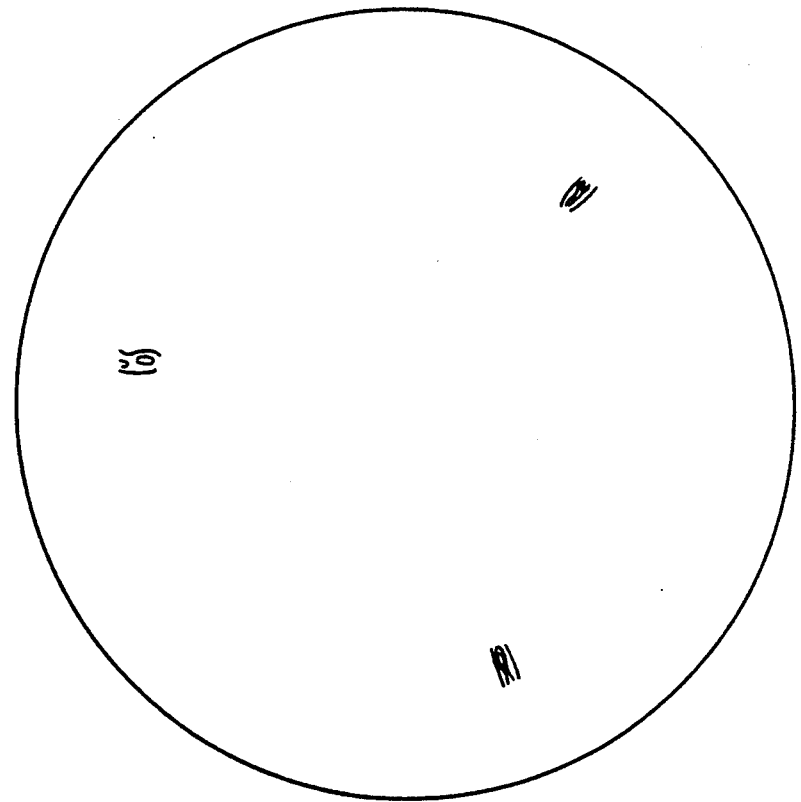
FIG. 8 An x-ray pole figures of GaAs (111) reflection of the multilayer structure of Example 1.

FIG. 6 is an x-ray diffraction pattern and FIGS. 7 and 8 are pole patterns, taken after the LiTaO$_3$ upper layer was deposited. FIG. 6 clearly shows both the (111) orientation of the MgO buffer layer and the (0006) orientation of the LiTaO$_3$ film. The FWHM of the LiTaO$_3$(0006) rocking curve measured 2.1°. This c-axis orientation of LiTaO$_3$ is highly desirable for electro-optic or nonlinear optical applications. The in-plane orientation of the LiTaO$_3$ film was determined with the pole figure of FIG. 7. The analysis was performed for the (01-12) plane of LiTaO$_3$ and clearly shows in-plane orientation. LiTaO$_3$ belongs to the 3 m crystal class and exhibits a three fold rotation symmetry about the c-axis, which leads to three spots in the pole figure. FIG. 7 shows six spots indicating that the film was twinned in-plane. However, this twinned structure would not affect the refractive index, nonlinear susceptibility and light scattering. FIG. 8 is a pole figure of the (200) plane of the underlying GaAs substrate. A comparison of the results obtained from LiTaO$_3$ and that from the underlying GaAs in FIG. 8 indicated that a c-oriented LiTaO$_3$ film was grown epitaxially on (111) GaAs with an in-plane alignment of LiTaO$_3$[1100] parallel to GaAs [110]. This provides a practical waveguide since ellipsometric measurements of refractive indices of MgO films grown on (111) GaAs and m-line spectroscopic measurements of refractive indices of LiTaO$_3$ films grown on Al$_2$O$_3$ show values of 1.733 and 2.18.

It is believed that the crystal quality of LiTaO$_3$ can be improved by increasing the growth temperature to 600°-650° C.

Rutherford backscattering spectrometry (RBS) was conducted on the multilayer structure and provided the spectrum shown in FIG. 9. The peak centered at 1.76 MeV corresponds to Ta in the surface layer. The peak appearing at 0.86 MeV is due to overlapping Mg and GaAs signals. The step observed at energies below 0.71 MeV is attributable to helium ions scattered from oxygen. The spectrum can be best fitted by a simulation of a bilayered structure with the stoichiometric ration of 1.0 Mg to 1.0 Oxygen and of 1.15 Li to 0.97 Ta to 3 Oxygen. The rear edge of the Ta profile and the front edge of the GaAs profile are abrupt, indicating limited interfacial reaction.

The following Comparative Experiments illuminate the significance of the invention.

COMPARATIVE EXPERIMENT 1

In this experiment, we illustrate the importance of having a proper diffusion buffer. Both CaF$_2$ and BaF$_2$ layers with a thickness of about 200 nm were epitaxially grown on (111)Si by e-beam evaporation in an ultrahigh vacuum system at 600° C. A LiTaO$_3$ layer was then deposited on the fluoride layer using laser ablation, as described in Example 1. X-ray analysis showed that no reflection lines corresponded to the LiTaO$_3$ phase and the lines from the epitaxial fluorides diminished as compared to an as-grown fluoride film, indicating interactions between fluorides and LiTaO$_3$. It was also found that the fluorides react with Si in the presence of oxygen, thus deteriorating the crystal quality of fluorides and consequently impacting the growth of epitaxial LiTaO$_3$ films.

COMPARATIVE EXAMPLE 2

This experiment illustrates the need for selecting diffusion buffers that can be oriented on semiconductor substrates. Thin films of MgAl$_2$O$_4$ were deposited on Si from a single ceramic target by rf magnetron sputtering at a power of 100 W. The gas pressure was 20 mTorr with 75% argon and 25% oxygen and the substrate temperature was in the range of 550°–650° C. After deposition, the samples were cooled to 100° C. in 30 Torr of pure oxygen. X-ray analysis reveals no crystalline phases present in the as-grown film, indicating that higher temperatures are required for the growth of epitaxial $MgAl_2O_4$ films than that for MgO. However, the temperature is beyond the limit set for GaAs due to GaAs dissociation The invention has been described in detail with particular reference to preferred embodiments thereof, but it will be understood that variations and modifications can be effected within the spirit and scope of the invention.

What is claimed is:

1. A multilayer structure comprising in order:
   a (111)-oriented single crystal substrate, said substrate being doped or undoped, said substrate being a semiconductor selected from the group consisting of $Si_xGe_{1-x}$ semiconductors, wherein x is from 0 to 1, and semiconductors having at least one element selected from the group consisting of Al, Ca, and In and at least one element selected from the group consisting of N, P, As, and Sb, said substrate defining a substrate superlattice dimension equal to 3 times a sublattice constant of said substrate; and
   an epitaxial metal oxide buffer layer having a threefold rotation symmetry about the substrate <111>direction, said buffer layer defining a buffer layer superlattice dimension equal to 4 times the oxygen-to-oxygen lattice spacing of said buffer layer, said buffer layer superlattice dimension being within 15 percent of said substrate superlattice dimension.

2. The multilayer structure of claim 1 further comprising an epitaxial metal oxide film deposited on said buffer layer.

3. The multilayer structure of claim 1 wherein said buffer layer is selected from the group consisting of (111)MgO, (0001)$Al_2O_3$, (0001)$Ga_2O_3$, and (111)$SrTiO_3$.

4. The multilayer structure of claim 3 further comprising an epitaxial film of (0001)$LiNb_xTa_{1-x}O_3$, wherein x is from 0 to 1, deposited on said buffer layer.

5. The multilayer structure of claim 4 wherein said substrate is selected from the group consisting of GaP, InP, InAs, GaSb, $Al_xGa_{1-x}As$, and $Si_xGe_{1-x}$, wherein x is from 0 to 1.

6. The multilayer structure of claim 1 wherein said buffer layer is (111)MgO.

7. The multilayer structure of claim 6 further comprising a nonlinear optical film deposited on said buffer layer.

8. The multilayer structure of claim 6 further comprising an epitaxial film of (0001)$LiNb_xTa_{1-x}O_3$, wherein x is from 0 to 1, deposited on said buffer layer.

9. The multilayer structure of claim 6 wherein said substrate is $Al_xGa_{1-x}As$, wherein x is from 0 to 1.

10. A multilayer structure comprising in order: a (111)-oriented single crystal semiconductor substrate, said substrate being doped or undoped and being selected from the group consisting of GaP, InP, InAs, GaSb, $Al_xGa_{1-x}As$, and $Si_xGe_{1-x}$, wherein x is from 0 to 1; and an epitaxial metal oxide buffer layer selected from the group consisting of (111)MgO, (0001)$Al_2O_3$, (0001)$Ga_2O_3$, and (111)$SrTiO_3$, said substrate defining a substrate superlattice dimension equal to 3 times a sublattice constant of said substrate, said buffer layer defining a buffer layer superlattice dimension equal to 4 times the oxygen-to-oxygen lattice spacing of said buffer layer, said buffer layer superlattice dimension being within 10 percent of said substrate superlattice dimension.

11. The multilayer structure of claim 10 wherein said substrate is $Al_xGa_{1-x}As$, wherein x is from 0 to 1.

12. The multilayer structure of claim 10 further comprising an epitaxial film of (0001)$LiNb_xTa_{1-x}O_3$, wherein x is from 0 to 1, deposited on said buffer layer.

13. The multilayer structure of claim 12 wherein said substrate is GaAs.

14. A multilayer structure comprising in order: a (111)-oriented single crystal semiconductor substrate, said substrate being doped or undoped and being selected from the group consisting of GaP, InP, InAs, GaSb, $Al_xGa_{1-x}As$, and $Si_xGe_{1-x}$, wherein x is from 0 to 1; and an epitaxial (111)MgO buffer layer.

15. The multilayer structure of claim 14 further comprising a nonlinear optical film deposited on said buffer layer.

16. The multilayer structure of claim 14 further comprising an epitaxial film of (0001)$LiNb_xTa_{1-x}O_3$, wherein x is from 0 to 1, deposited on said buffer layer.

17. The multilayer structure of claim 16 wherein said substrate is $Al_xGa_{1-x}As$, wherein x is from 0 to 1.

18. The multilayer structure of claim 16 wherein said substrate is GaAs.

19. The multilayer structure of claim 14 wherein said substrate is $Al_xGa_{1-x}As$, wherein x is from 0 to 1.

* * * * *